United States Patent [19]

Schwierz

[11] 4,232,263

[45] Nov. 4, 1980

[54] MEASURING INSTALLATION FOR FREQUENCY ANALYSIS OF SIGNAL LEVELS WITHIN A LARGE AMPLITUDE RANGE

[75] Inventor: Theodor Schwierz, Klingen, Fed. Rep. of Germany

[73] Assignee: Siemens Aktiengesellschaft, Berlin & Munich, Fed. Rep. of Germany

[21] Appl. No.: 971,006

[22] Filed: Dec. 19, 1978

[30] Foreign Application Priority Data

Dec. 27, 1977 [DE] Fed. Rep. of Germany ....... 2758154

[51] Int. Cl.$^3$ .............................................. G01R 23/16
[52] U.S. Cl. .................................. 324/77 B; 324/77 E
[58] Field of Search ................. 324/77 B, 77 D, 77 C, 324/77 CS, 77 E, 140 D

[56] References Cited

U.S. PATENT DOCUMENTS

| 3,418,574 | 12/1968 | Wyckoff | 324/77 D |
|---|---|---|---|
| 3,470,468 | 9/1969 | Halpern | 324/77 E |
| 3,971,927 | 7/1976 | Speiser et al. | 324/77 B |
| 4,005,417 | 1/1977 | Collins | 324/77 B |

*Primary Examiner*—Michael J. Tokar
*Attorney, Agent, or Firm*—Hill, Van Santen, Steadman, Chiara & Simpson

[57] ABSTRACT

The invention relates to a measuring installation for a frequency analysis of signal levels within a large volume range which is to be extremely fast. The measuring installation has an intermediate frequency amplifier arrangement with two and more selective amplifiers (SV1, SV2, SC3) which are equipped in each case with an automatic amplification regulation. The loop is broad band and contains a controllable attenuator (PR1, PR2, PR3) and a variable-gain amplifier (RV1, RV2, RV3). The band width of the selective amplifiers connected in series is reduced step-by-step in the direction of the signal flow. The regulating variables of the variable-gain amplifiers are summed in an adder (Ad) and supplied to a signal level evaluation and display installation (AA).

7 Claims, 4 Drawing Figures

MEASURING INSTALLATION FOR FREQUENCY ANALYSIS OF SIGNAL LEVELS WITHIN A LARGE AMPLITUDE RANGE

BACKGROUND OF THE INVENTION

1. Field of the Invention

The invention relates to a measuring installation for a frequency analysis of signal levels within a large amplitude range, consisting of a frequency translation installation with a synthesizer which controllably generates the conversion frequencies, an intermediate frequency amplifier arrangement that can be regulated in its amplification and a signal level evaluation and display installation.

2. Description of the Prior Art

Frequency analyzers of this type can, for example, find application in measuring installations which serve the purpose of detecting microtransmitters for listening or monitoring purposes. The measurement of terrestrial radiation represents another area of application. For the systematic reconnaisance of electromagnetic radiation within a wide frequency range, flying objects or, respectively, space vehicles are particularly well suited. The relatively fast movement which is carried out by space vehicles, particularly by satellites, in this case requires a reception system which quarantees a maximum resolution—up to the physical boundaries—in the frequency and level range in extremely short times. In other words, the quality of the measuring results is essentially determined by the attainable geographic, frequency and level-wise resolution of the radiofrequency-power-density spectrum to be examined.

SUMMARY OF THE INVENTION

The local resolution is largely determined by the orbit data of the space vehicle and the antenna convergence. The frequency resolution is determined by the available measuring time and the width of the radio frequency band to be scanned. The level resolution depends on the power density of the radiation to be expected at the receiver input and on the minimally measurable input level based upon the minimum width of the intermediate frequency band.

As relevant investigations show, the required minimum dwell time at a specific frequency is essentially fixed by the width of the intermediate frequency band transient used and by the necessary time for the measurement of the large range. With a predetermined geographic resolution, i.e. the time interval which is available for the evaluation of a received spectrum related to a specific space sector, the quality of the measuring results can only be optimized in that the required minimum dwell time at a specific frequency is kept as small as possible.

The invention is based on the object of a solution for a measuring installation for executing an extremely fast frequency analysis of signal levels within a large volume range which renders an extremely fast automatic level measurement possible with high selection properties.

Proceeding from a measuring installation for a frequency analysis of signal levels within a large band width range consisting of a frequency translation installation with a synthesizer that controllably generates the conversion frequencies, an intermediate frequency amplifier arrangement that can be controlled in its amplification and a signal level evaluation and display installation, this object is achieved with the invention in that the intermediate frequency amplifier arrangement includes two and more selective amplifiers with automatic amplification regulation mounted behind one another, and the band width is diminished from amplifier to amplifier in the direction of the receiving signal level to be amplified. Also, the regulating variables for controlling the individual amplifiers are summed in an adder with consideration of the predetermined regulating characteristics; and in the sum value is supplied from the output of the adder to the signal evaluation and display means.

The invention is based on the perception that the velocity of the level measurement over a large frequency range can then be accomplished extremely fast when only the last selective amplifier is fixed with regard to its selectivity for the desired frequency resolution. In this manner, it is possible to design the multi-stage regulation required in the case of a large volume range in such manner that the regulation time is practically determined by the regulation of the last amplifier exhibiting the highest selectivity.

For an optimization of the frequency precision, it is desirable to undertake the control of the synthesizer for a non-sequential frequency alternation in stages which have sizes adapted to the band width of the selective amplifier which is present at the final position in the train of the amplification of the received signal level which fixes the spectral resolution. Thus, the sum value at the output of the adder is supplied to the signal level evaluation and display installation in the pulse of the frequency variations of the synthesizer.

In order to avoid measurement errors in the analysis of a larger frequency range because of the evaluation of image frequencies, it is practical to arrange further converters respectively supplied with a suitable conversion oscillation frequency having fixed frequencies between the selective amplifiers.

In a preferred embodiment in which a non-sequential frequency change of the synthesizer is employed, the signal level evaluation and display installation has an analog-digital converter at its input which is likewise controlled by the pulse of the frequency changes of the synthesizer.

The relationships are optimized when the regulation of the amplifiers each exhibit a logarithmic-linear characteristic and the adder is designed for a linear summation.

In a further particularly preferred embodiment, the automatic amplification regulation of the selective amplifiers include a controllable attenuator arranged between two amplifier stages. Thus, the loop comprising the attenuator, a variable-gain amplifier with a second output for the adder and an amplifier stage is arranged for broad band detection. In other words, the loop does not contain the selective network determining the selectivity of the selective amplifiers, so that the regulation functions extremely quickly.

In order to suppress over-amplifications of the amplifiers and thus errors in the measuring results, each variable-gain amplifier has a suitably dimensioned response threshold.

The invention is to be explained in even greater detail in the following on the basis of a sample embodiment illustrated in the drawing.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
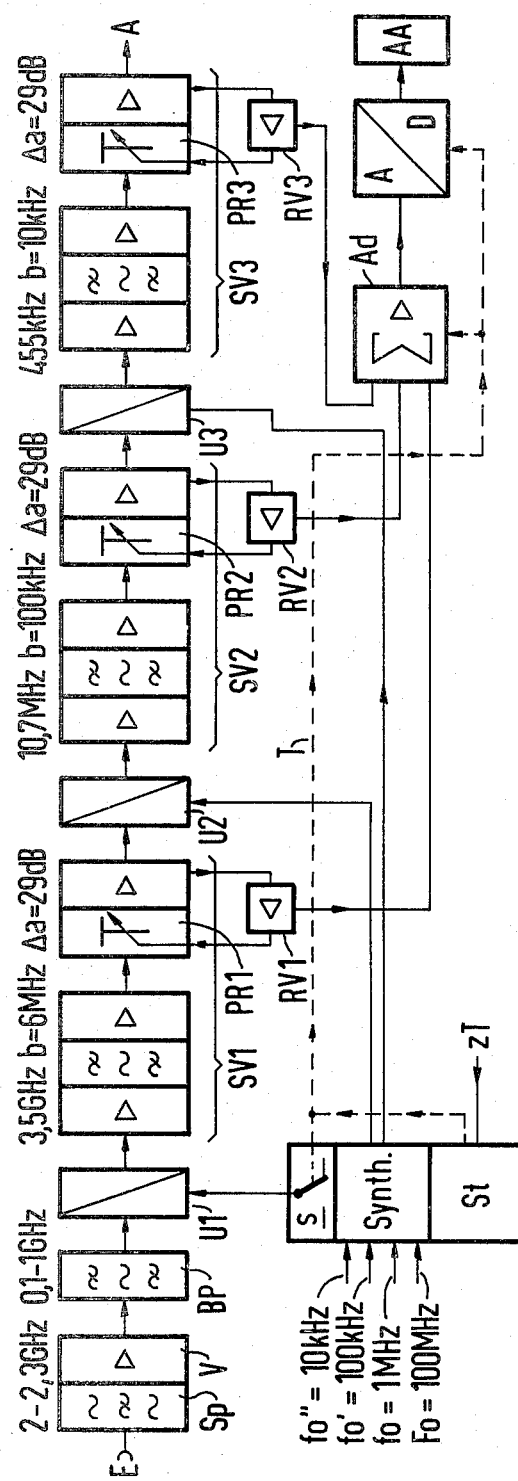
FIG. 1 is the block diagram of a measuring installation according to the invention.

The reception system according to FIG. 1 is connected with the antenna of a space vehicle and at its input E receives a signal spectrum from this antenna which varies as a function of its spatial orientation. The receiver includes an interlock Sp which receives the input E and operates for the on-board transmitter in the frequency range of 2 through 2.3 GHz. A broad band pre-amplifier is connected to the interlock Sp and supplies an output to a band pass filter BP for the frequency range to be investigated of for example, 0.1 through 1 GHz. The amplified signal from filter U1 is supplied to the converter U1. The converter U1 receives a conversion input signal from a synthesizer Synth controlled by means of the control installation St. The synthesizer changes its frequency 90,000 times in steps of 10 kHz during the cycle pulse ZT supplied to the control installation St and determines the frequency resolution of the signal spectrum in the range between 0.1 and 1 GHz. Reference frequencies for frequency stabilization of the synthesizer of signals having frequencies Fo=100 MHz, fo=1 MHz, fo'=100 kHz and fo''=10 kHz are supplied and derived from a stabilized frequency standard. At the output of the synthesizer an additional switch s which briefly interrupts the connection of the output to the converter U1 during the time realm of the transition from one frequency to the next. In this manner, the transient effects which occur during the change-over cannot effect the received signal level. The converter U1 converts the signal supplied to it to a first intermediate frequency of 3.5 GHz. This intermediate frequency signal is supplied to the selective amplifier SV1 which has a selective network having a band width of 6 MHz. The amplifier SV1 has a total of 3 amplification stages. The previously mentioned selective network is located between the first and second amplification stages and a controllable attenuator PR1 with an attenuation range Δ a of 29 decibels is mounted between the second and third amplification stages. The attenuator PR1 together with the third amplification stage and a variable-gain amplifier RV1 connected as shown comprise an automatically functioning level control. The variable-gain amplifier RV1 has a response threshold and above the threshold it drives the controllable attenuator PR1 from its minimum attenuation in the direction to its maximum attenuation. The variable-gain amplifier RV1 further has a second output which is supplied to one of the three inputs of an adder Ad.

A second converter U2 which converts the 3.5 GHz intermediate frequency signal into a second intermediate frequency position of 10.7 MHz receives the output of the selective amplifier SV1. The intermediate frequency signal of 10.7 MHz is supplied to the second selective amplifier SV2, which is constructed like the selective amplifier SV1 and has first, second and third amplifiers. Its controllable attenuator is designed PR2 and variable-gain amplifier RV2. A second output of the variable-gain amplifier is also connected to a second input of the adder Ad. The band width b of the selective network of the second selective amplifier SV2 is 100 kHz. A third converter U3 which converts the signal into the third intermediate frequency position of 455 kHz receives the output of the second selective amplifier SV2. A third selective amplifier SV3 has an adjustable attenuator PR3 and a third variable-gain amplifier RV3 is constructed in a manner similar to the other two selective amplifiers SV1 and SV2. It receives the output of converter U3. The second output of the variable-gain amplifier RV3 is connected to the third input of the adder. Depending upon the desired resolution, the band width b of the selective network SV3 is reduced to 10 kHz. The conversion oscillation frequencies for the further converters U2 and U3 are generated by the synthesizer Synth, but are, in contrast to the conversion oscillation frequency for the converter U1, fixed frequencies.

The variable-gain amplifiers RV1, RV2, RV3 have a logarithmic-linear characteristic, so that the sum value of the regulating variables of these amplifiers which corresponds to the level value of the signal, respectively, determined frequencywise appear logarithmic-linear at the output of the adder Ad. An analog-digital converter A/D whose digital output signal is supplied to the signal level evaluation and display installation AA receives the output of the adder Ad. The adder Ad, the analog-digital converter A/D and the switch s of the synthesizer Synth are controlled by the clock pulse T, which assures that the delivery of the sum value from the adder Ad to the analog-digital converter A/D always ensues at the end of the frequency measurement interval, at a time in which the regulating variables, particularly the regulating variable of the amplifier RV3, are no longer affected by the transient effects that are caused by the selective network of the amplifier SV3. Thus, each of the selective amplifiers SV1, SV2 and SV3 comprise a first input amplifier, followed by a band pass filter which supplies a signal to a second amplifier. Each second amplifier supplies a signal to a controllable attenuator PR1, PR2 and PR3, respectively. A third output amplifier in each selective amplifier receives the output of a controllable attenuator and supplies an output to a variable gain amplifier RV1, RV2 or RV3 respectively. The amplifiers RV1, RV2 and RV3 each respectively control the variable attenuators PR1, PR2 and PR3.

Figure 2:
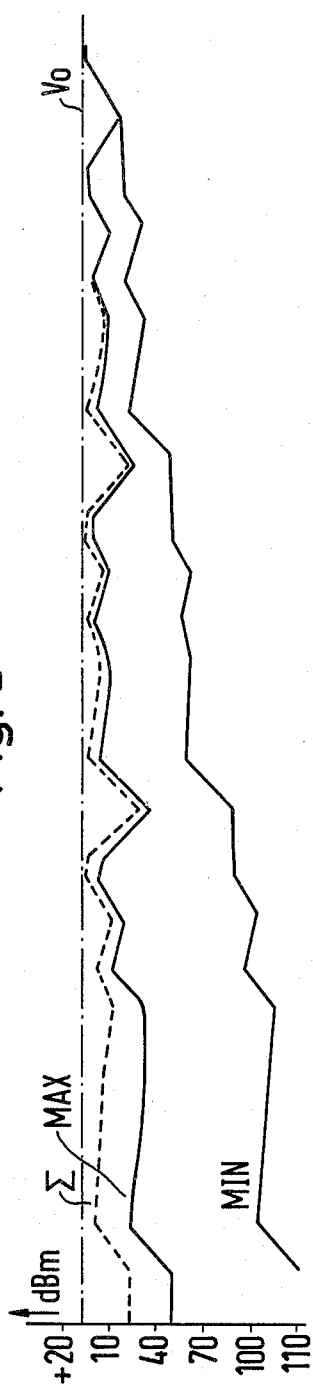
FIG. 2 is a level diagram explaining the manner of functioning of the circuit according to FIG. 1.

In FIG. 2, the plot of the level of the signal train in the circuit of FIG. 1 is indicated in dBm and for various cases. The curves marked MIN and MAX indicate the signal paths of the minimum and maximum levels of the signal portions to be measured in frequency occur at the input E at the frequency intervals of 10 kHz. The dot-dash line indicates the response threshold Vo of the variable-gain amplifier at which the signal at output A of the third selective amplifier SV3 according to FIG. 1 is regulated. The curve ε shown by a broken line indicates the case in which further strong spectral lines are present in the neighboring areas of the frequency interval of 10 kHz which has been specifically selected. Naturally, because of the lower selectivity of the first and of the second selective amplifiers SV1 and SV2 these pass these amplifiers and are only suppressed in the last selective amplifier SV3.

Figure 3:
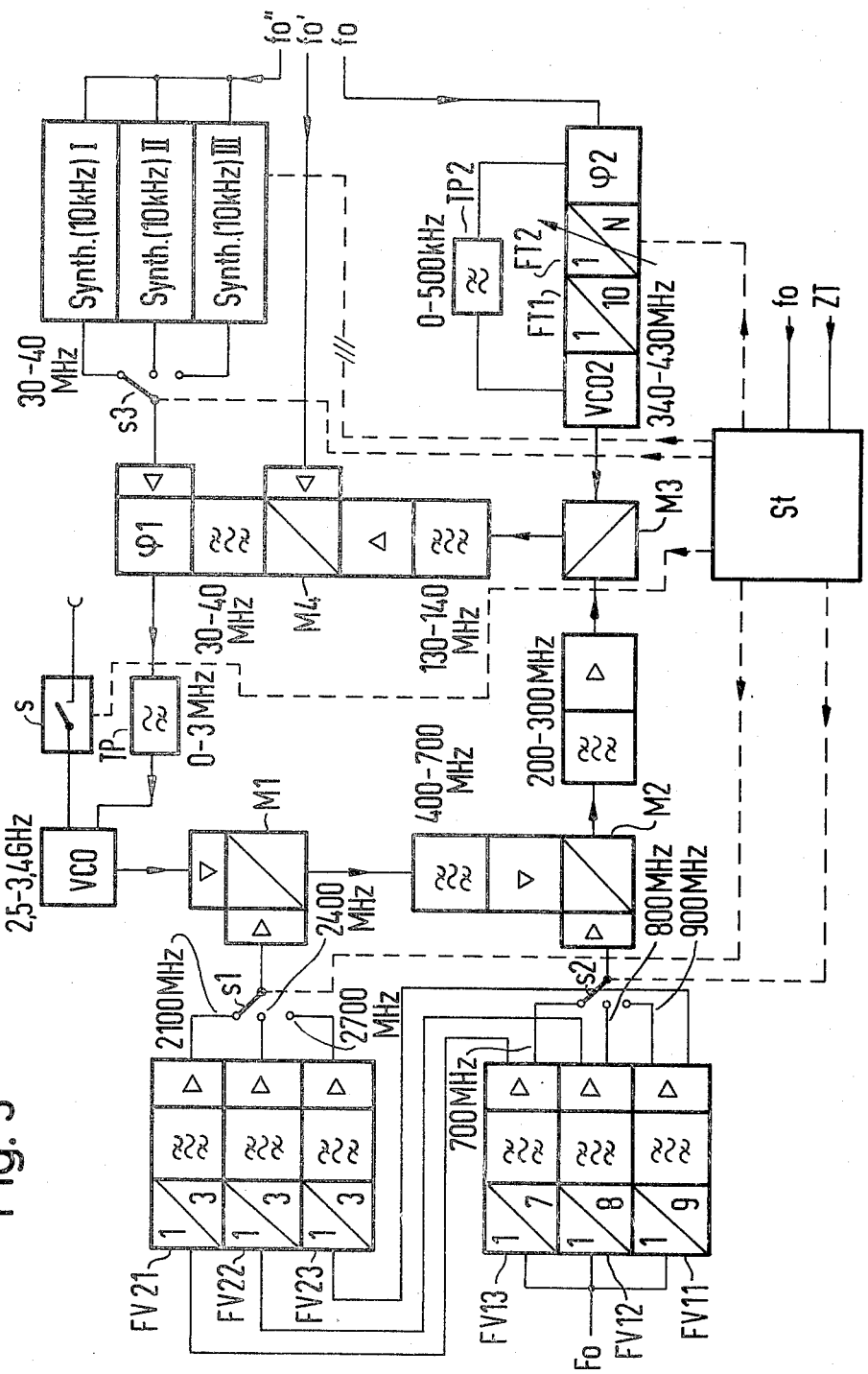
FIG. 3 is the block diagram of a synthesizer according to FIG. 1 exhibiting greater detail.

In FIG. 3, the circuit diagram shows further details of the synthesizer of FIG. 1. A controllable oscillator VCO has a frequency range of 2.5 through 3.4 GHz and its output is connected with the converter U1 via the switch s illustrated in FIG. 1. The loop for this controllable oscillator VCO comprises a total of four mixers M1 through M4 connected in a loop circuit as shown. A phase comparator $\phi 1$ receives the output of mixer M4 and an input through switch S3. A loop filter TP in the form of a low-pass filter with a limiting frequency of 3 MHz receives the output of comparator $\phi 1$ and supplies an input to VCO. The synthesizer further contains two frequency multiplier arrangements switched behind one another and the first frequency multiplier arrangement derives the frequencies 700, 800 and 900 MHz from the standard frequency Fo with the frequency multipliers FV11 through FV13, and the second group of frequency multipliers derives the frequencies 2100, 2400 and 2700 MHz with the frequency dividers FV21 through FV23. The frequencies 2100, 2400 and 2700 MHz can be selectively applied via the switch S1 to the mixer M1 at whose first input the output oscillation of the oscillator VCO is received. The frequencies between 400 and 700 MHz generated by means of this mixer are mixed down into the frequency range of 200 through 300 MHz in the second mixer M2 with one of the frequencies 700, 800 and 900 MHz connectible via the switch s2. The second input of the third mixer M3 is connected with an oscillator VCO2 provided with a phase regulation loop, and this oscillator covers the frequency range from 340 through 430 MHz. The phase regulation loop has a frequency divider FT1 to 1 to 10 as well as a variable frequency divider FT2, a phase comparator $\phi 2$ and a loop filter TP2 with a limiting frequency of 500 kHz. This oscillator VCO2 is crystal-stabilized with the phase comparator $\phi 2$ which receives at its input the standard frequency fo. At the output of the mixer M3, the frequency band between 130 and 140 MHz occurs which is mixed down to 30 through 40 MHz in the mixer M4 which receives at its second input the standard frequency fo'. In the phase comparator $\phi 1$, the frequencies between 30 and 40 MHz are compared with one of the output oscillations of the synthesizers SynthI through SynthIII alternately connectible via the switch s3. The synthesizers SynthI through SynthIII are constructed analogously to the local oscillator VCO2 illustrated and have phase regulation loops. They are different from only in that the fixed frequency divider FT1 is omitted and the standard frequency fo" is supplied as a reference frequency to each of these synthesizers. All three synthesizers likewise generate an output oscillation in the frequency range between 30 and 40 MHz and are connected in succession via the switch s3. The tripling of the synthesizer circuit here has the purpose of avoiding the relatively large building-up time of the phase loops in that at the time of connecting the one synthesizer via the switch s3, the other synthesizers can be re-tuned to their respectively next frequencies.

The total circuit is controlled by means of the control installation St connected as shown which in turn is supplied with the cycle pulse ZT and the standard frequency fo in such a manner that the oscillation VCO is changed over during a cycle of the cycle pulse ZT steps of 10 kHz across the frequency range of 900 MHz, beginning from 3.4 GHz.

Figure 4:
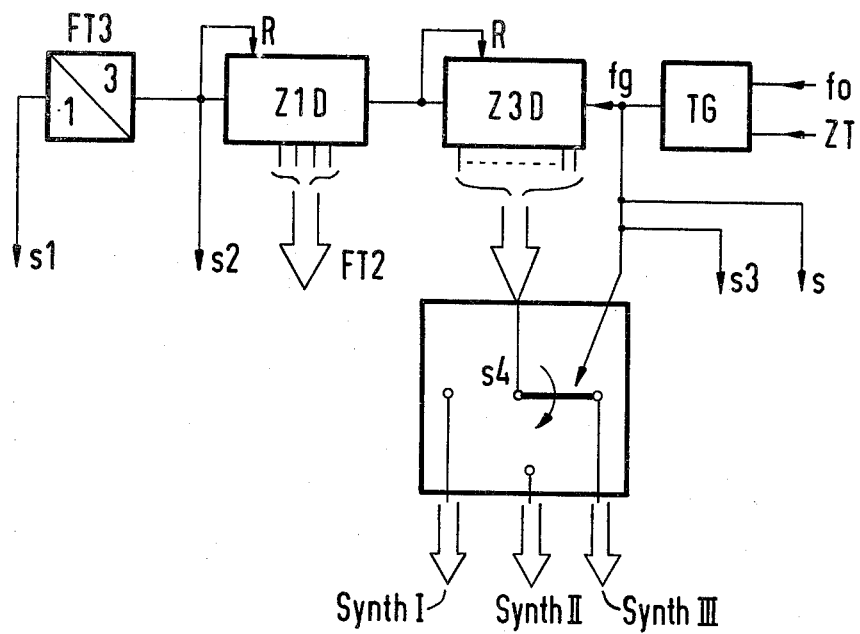
FIG. 4 is the block diagram of a control installation according to FIGS. 1 and 3 exhibiting further details.

The block diagram of the control installation St illustrated in FIG. 4 exhibits the pulse generator TG to which two mutually synchronous signals, the cycle pulse ZT and the standard frequency fo are supplied. From this, the pulse generator derives an oscillation signal with the basic frequency fg which, with reference to the sample embodiment of the synthesizer according to FIG. 3 and with an assumed cycle time of 32 seconds, amounts to 2816 Hz. Thereby, for the generation of 90,000 frequency values within a cycle time, a change-over cycle is obtained which, in the interval of frequencies following one another in 10 kHz steps, amounts to $355\mu$ seconds. The switch s is briefly opened in the rhythm of the basic frequency fg in order, as has already been explained, to bridge the change-over time of the synthesizer. Further, the switch s3 according to FIG. 3 is controlled with this basic frequency fg in such manner that the synthesizers SynthI through III are connected to the phase comparator $\phi 1$ in sequence at this timing.

The three-decade counter Z3D is post-connected to the output of the pulse generator TG, and the three-decade counter has digital outputs which alternately connected to the control inputs of the synthesizers SynthI through III via the switch s4 which is likewise controlled with the basic frequency fg. As soon as the three-decade counter Z3D has arrived at its final position, it emits a pulse to the one decade counter Z1D connected on its output side. At the same time, it is again brought into its initial position by this pulse via the reset input R. Via its outputs, the one-decade counter Z1D digitally controls the variable frequency divider FT2 which is arranged in the loop of the local oscillator VCO2. As soon as the one-decade counter has reached its final position, it emits a pulse which functions in a threefold manner. First, it switches the one-decade counter Z1D back into its initial position via the reset input R; second, it controls the switch s2 according to FIG. 3; and, third, it controls the switch s1 over the frequency divider FT3.

Although the invention has been described with respect to preferred embodiments, it is not to be so limited as changes and modifications can be made which are within the full intended scope of the invention as defined by the appended claims.

I claim as my invention:

1. A measuring installation for the frequency analysis of signal levels within a large amplitude range consisting of a frequency conversion installation with a synthesizer controllably generating the conversion frequencies, an intermediate frequency amplifier arrangement that can be controlled in its amplification, and a signal level evaluation and display installation, characterized in that for the execution of an extremely fast frequency analysis, the intermediate frequency amplifier arrangement has two or more selective amplifiers (SV1, SV2, SV3) arranged in series with automatic amplification regulation, and whose band width diminishes from amplifier to amplifier in the direction of the path of the received signal level to be amplified; and the regulating variables occurring at the individual amplifiers SV1, SV2 and SV3 are summed with consideration of the prescribed regulating characteristics in an adder (Ad); and the sum value is delivered from the output of the adder Ad to the signal level evaluation and display installation (AA).

2. A measuring installation according to claim 1, characterized in that for a non-sequential frequency alteration, the control of the synthesizer (Synth) occurs in steps and the magnitude is adapted to the band width of the selective amplifier (SV3) which is present at the last position in the path of the amplification of the received signal level and which determines the spectral resolution; and in the sum value at the output of the adder (Ad) is supplied to the signal level evaluation and display installation (AA) at the pulse rate of the frequency alternation of the synthesizer.

3. A measuring installation according to claim 2, characterized in that further converters (U2, U3) are respectively supplied with a suitable conversion oscillation of a fixed frequency are connected between the selective amplifiers (SV1, SV2, SV3).

4. A measuring installation according to claim 2, characterized in that the signal level evaluation and display installation (AA) has an analog-digital converter (A/D) at its input side which is controlled at the pulse rate of the synthesizer (Synth).

5. A measuring installation according to claim 4, characterized in that the control of the amplifiers (SV1, SV2, SV3) respectively has a logarithmic-linear characteristic and the adder (Ad) is designed for a linear summation.

6. A measuring installation according to claim 5, characterized in that the automatic amplification regulation of the selective amplifiers (SV1, SV2, SV3) has a controllable attenuator (PR1, PR2, PR3) arranged between two of the amplifier stages; and the loop comprising said attenuator, a variable-gain amplifier (RV1, RV2, RV3) with a second output for the adder (Ad) and an amplifier stage is constructed to have broad pass bands.

7. A measuring installation according to claim 6, characterized in that each variable-gain amplifier (RV1, RV2, RV3) has a response threshold.

* * * * *